US007020550B2

(12) United States Patent
Yokochi et al.

(10) Patent No.: US 7,020,550 B2
(45) Date of Patent: Mar. 28, 2006

(54) VEHICLE ELECTRONIC CONTROLLER

(75) Inventors: Masaru Yokochi, Nagoya (JP); Yasuhiro Tanaka, Nisshin (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 0 days.

(21) Appl. No.: 10/956,066

(22) Filed: Oct. 4, 2004

(65) Prior Publication Data

US 2005/0049768 A1 Mar. 3, 2005

Related U.S. Application Data

(63) Continuation of application No. 10/442,172, filed on May 21, 2003, now abandoned.

(30) Foreign Application Priority Data

May 22, 2002 (JP) ............................ 2002-147711

(51) Int. Cl.
*G06F 19/00* (2006.01)

(52) U.S. Cl. ............................ 701/36; 701/29; 714/21; 708/530; 123/396; 180/79.1

(58) Field of Classification Search .................. 701/36, 701/43, 29, 33, 39; 714/736, 2; 395/182.08, 395/182.21; 700/2, 79, 21; 709/208, 211; 708/530, 490; 340/438; 123/396, 492; 180/79.1
See application file for complete search history.

(56) References Cited

U.S. PATENT DOCUMENTS

| | | | | | |
|---|---|---|---|---|---|
| 4,049,957 | A * | 9/1977 | Kera et al. | .................... | 714/10 |
| 5,666,544 | A * | 9/1997 | Matsumoto et al. | ........... | 712/1 |
| 5,845,489 | A * | 12/1998 | Dohta et al. | .................. | 60/276 |
| 5,951,617 | A * | 9/1999 | Shinohara et al. | .......... | 701/110 |
| 5,980,081 | A | 11/1999 | Watari et al. | ............... | 714/736 |
| 6,144,887 | A | 11/2000 | Kamiya et al. | ............... | 700/79 |
| 6,405,110 | B1 | 6/2002 | Abe et al. | ...................... | 701/29 |
| 6,415,210 | B1 | 7/2002 | Hozuka et al. | ............... | 701/29 |
| 6,493,593 | B1 | 12/2002 | Kamiya et al. | ................ | 700/2 |
| 6,636,989 | B1 | 10/2003 | Kondo et al. | ................ | 714/23 |

(Continued)

FOREIGN PATENT DOCUMENTS

| | | |
|---|---|---|
| JP | 06-286503 | 10/1994 |
| JP | 06-307274 | 11/1994 |
| JP | 2003-138981 | 5/2003 |

OTHER PUBLICATIONS

Copy of Japanese Office Action issued Oct. 4, 2005.

(Continued)

*Primary Examiner*—Jack Keith
*Assistant Examiner*—Tuan C To
(74) *Attorney, Agent, or Firm*—Kenyon & Kenyon

(57) ABSTRACT

A vehicle electronic controller for checking a control microcomputer with a common monitoring IC, which is used in different vehicles. The vehicle electronic controller includes a control microcomputer, which calculates control data to control an actuator installed in a vehicle in accordance with a driving condition of the vehicle, and a monitoring IC, which is connected to the control microcomputer and checks whether or not the control data is normal based on a determination value. The control microcomputer provides the determination value to the monitoring IC. The monitoring IC includes a memory device, which stores the determination value in a rewritable manner. The monitoring IC receives the determination value and stores the determination value in the memory device.

17 Claims, 3 Drawing Sheets

U.S. PATENT DOCUMENTS

| | | | | |
|---|---|---|---|---|
| 6,640,259 | B1 * | 10/2003 | Nakamoto et al. | 710/5 |
| 2001/0008987 | A1 | 7/2001 | Wada et al. | 701/29 |
| 2002/0123833 | A1 * | 9/2002 | Sakurai et al. | 701/33 |
| 2002/0143452 | A1 * | 10/2002 | Losey | 701/49 |

OTHER PUBLICATIONS

Copy of English Translation of Japanese Office Action issued Oct. 4, 2005.

* cited by examiner

VEHICLE ELECTRONIC CONTROLLER

This is a continuation of application Ser. No. 10/442,172 filed 21 May 2003, abandoned, the content of which is incorporated herein by reference in its entirety.

BACKGROUND OF THE INVENTION

The present invention relates to a vehicle electronic controller, and more particularly, to a technique for checking for abnormality of a control microcomputer, which controls an actuator installed in a vehicle.

Electronic throttles are installed in some recent vehicles to electrically measure the amount an accelerating has been depressed and control the degree of opening of a throttle valve in accordance with the depressed amount of the pedal. A vehicle employing the electronic throttle includes an actuator for driving a throttle valve. Therefore, when the vehicle is provided with a constant velocity driving function, by adding a few input devices and making system software changes, the constant velocity driving function is achieved without adding a throttle valve drive actuator exclusively for constant velocity driving.

Japanese Laid-Open Patent Publication No. 6-307274 proposes separating the microcomputer, which controls the throttle valve opening degree, into a main microcomputer and a sub-microcomputer for safety when adding the constant velocity driving function to the electronic throttle. In a vehicle electronic controller described in the publication, the sub-microcomputer, which has the same functions as the main microcomputer, retrieves calculation results from the main microcomputer (e.g., throttle valve opening degree) and compares the results with results that are calculated by the sub-microcomputer. If the compared results do not match, the sub-microcomputer determines that the main microcomputer is not functioning normally and stops electronic control of the throttle.

However, in the vehicle electronic controller of the publication, the sub-microcomputer uses a determination value that is stored in a ROM of the sub microcomputer to check control data of the main microcomputer. Since the determination value differs between vehicles, a different sub microcomputer must be produced for each vehicle. This increases costs of the vehicle electronic controller.

SUMMARY OF THE INVENTION

It is an object of the present invention to provide a vehicle electronic controller that uses the same monitoring IC ("integrated circuit"), which checks a control microcomputer regardless of the type of vehicle to reduce costs.

To achieve the above object, the present invention provides an electronic controller for a vehicle having an actuator. The electronic controller includes a control microcomputer for calculating control data to control the actuator in the vehicle in accordance with a driving condition of the vehicle, and a monitoring IC connected to the control microcomputer to check whether the control data is normal using a determination value, wherein the control microcomputer sends the determination value to the monitoring IC, and the monitoring IC includes a memory device for storing the determination value in a rewritable manner.

A further aspect of the present invention is an electronic controller for a vehicle having an actuator. The electronic controller includes a control microcomputer for calculating control data to control the actuator in the vehicle in accordance with a driving condition of the vehicle, a monitoring IC connected to the control microcomputer to check whether or not the control data is normal based on a determination value, and a rewritable non-volatile memory connected to the monitoring IC. The control microcomputer sends the determination value to the monitoring IC, and the monitoring IC receives the determination value and stores the determination value in the non-volatile memory.

A further aspect of the present invention is a method for checking an electronic controller for a vehicle. The electronic controller includes a control microcomputer, which calculates control data to control an actuator installed in the vehicle in accordance with a driving condition of the vehicle, and a monitoring IC, which is connected to the control microcomputer. The method includes storing a determination value in the control microcomputer to check whether the control data is normal, sending the determination value to the monitoring IC from the control microcomputer and checking the control data with the monitoring IC using the determination value.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
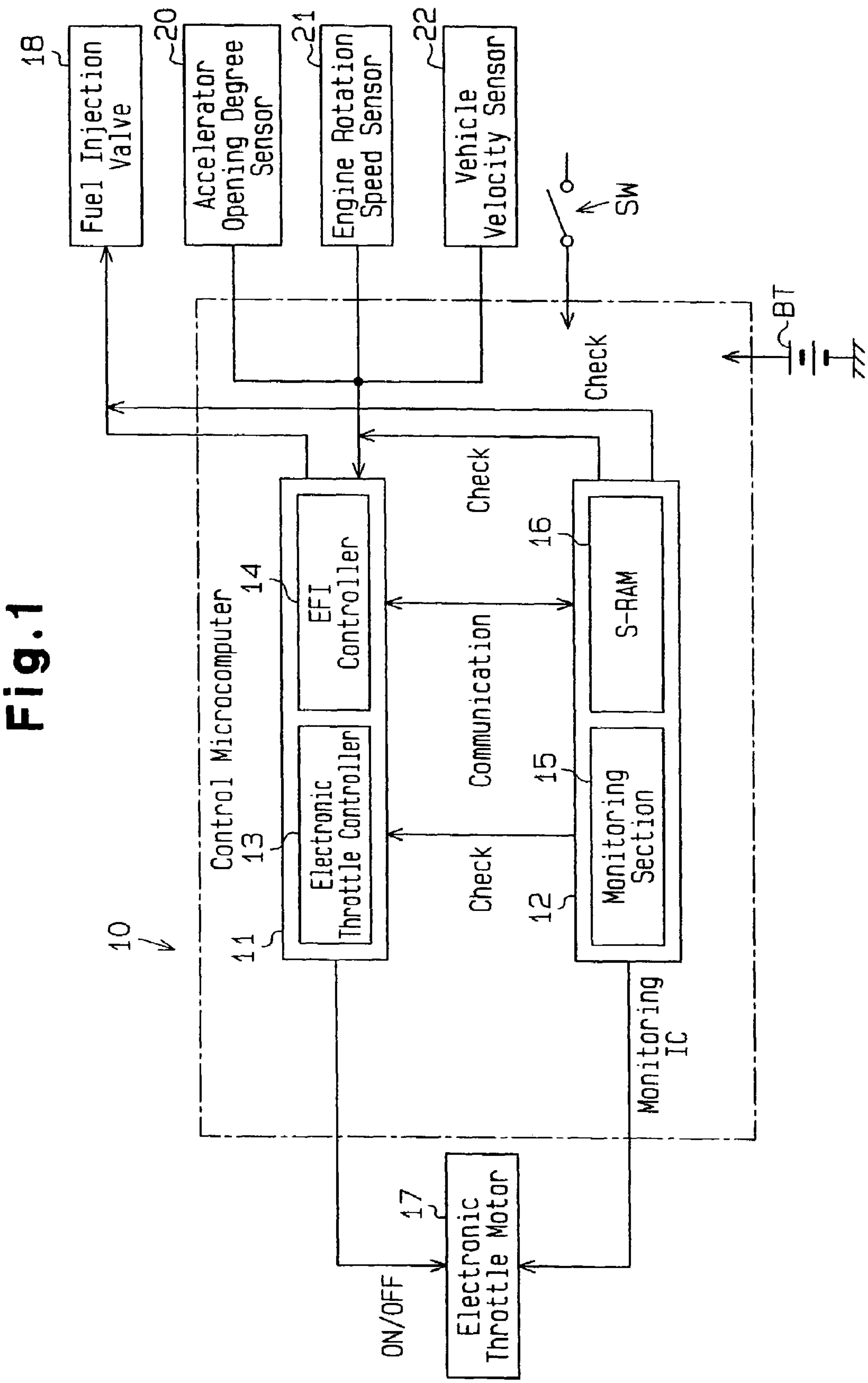
FIG. 1 is a schematic diagram of a vehicle electronic controller according to one embodiment of the present invention.

In the invention, like reference numerals are used for like elements throughout.

A preferred embodiment according to the present invention will now be described with reference to FIGS. 1 and 2. In the preferred embodiment, the present invention is embodied in a vehicle electronic controller (hereinafter, referred to as a vehicle ECU 10) that controls the driving condition of a vehicle. The vehicle ECU 10 functions to control a throttle valve.

Figure 2:
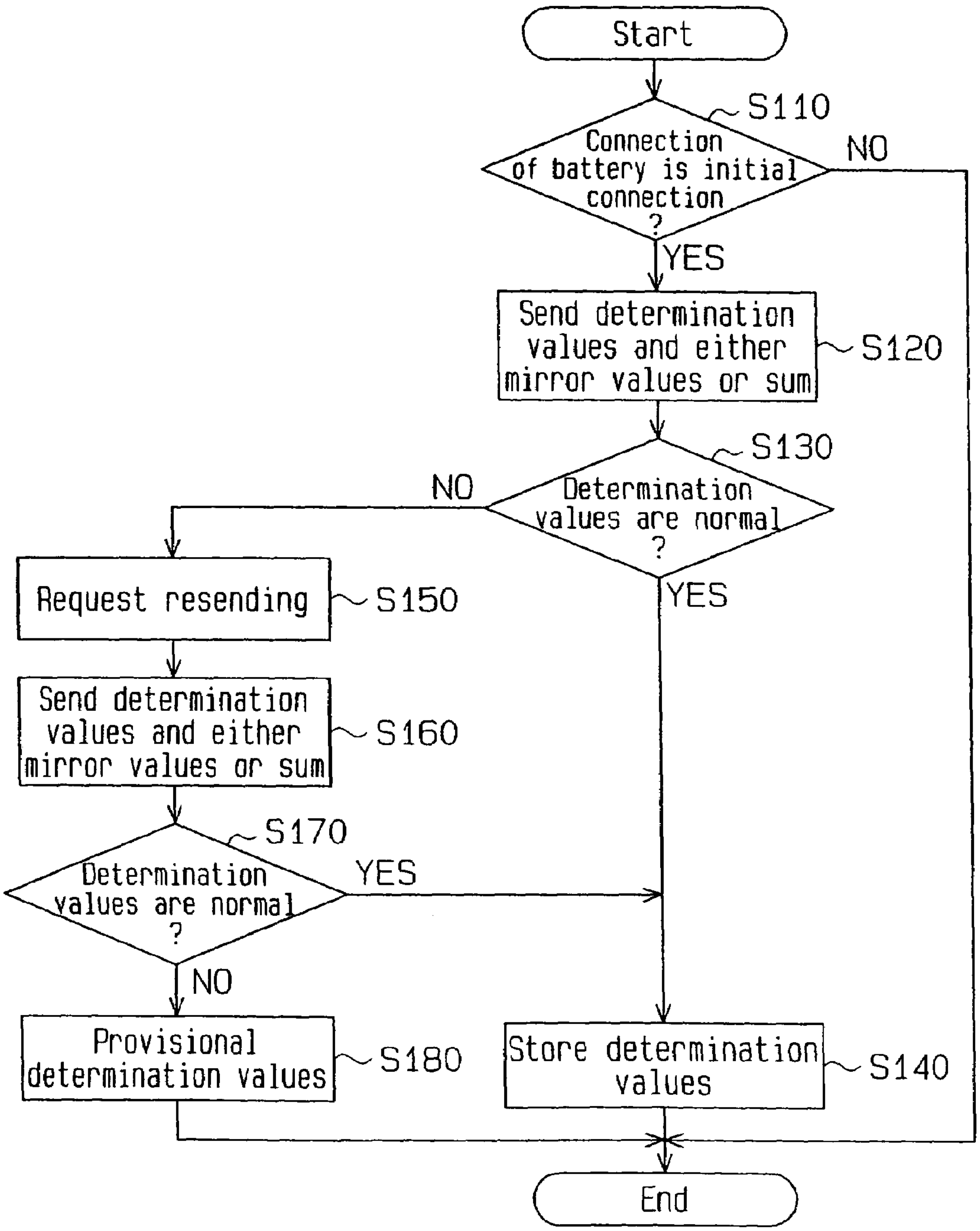
FIG. 2 is a flow chart showing a procedure for setting a determination value of a monitoring IC with respect to an S-RAM.

FIG. 1 is a schematic diagram of the vehicle ECU 10. Referring to FIG. 1, the vehicle ECU 10 includes a control microcomputer 11 and a monitoring IC ("integrated circuit") 12, which checks the control microcomputer 11. The control microcomputer 11 is configured by a known logical operation circuit, which includes a CPU, a ROM, and a RAM, and has an electronic throttle controller 13 and an EFI ("electronic fuel injection") controller 14.

The monitoring IC 12 includes a monitoring section 15 and a standby RAM (hereinafter, referred to as an S-RAM) 16. The S-RAM 16 is a memory device that stores a rewritable determination value, which is provided from the control microcomputer 11, to detect an abnormality in control data. The monitoring section 15 may be a CPU or a logical circuit.

The control microcomputer 11 has a control function and a communication function, which include electronic throttle control and fuel injection control. The ROM (not shown) of the control microcomputer 11 stores programs for performing the electronic throttle control and the fuel injection control. Further, the ROM of the control microcomputer 11 prestores determination values used to check an abnormality in control data of an electronic throttle motor 17 and an abnormality in control data of a fuel injection valve 18.

The electronic throttle controller 13 receives detection signals of an accelerator opening degree sensor 20, an engine rotation speed sensor 21, and a vehicle velocity sensor 22 and calculates the present throttle opening degree. The electronic throttle controller 13 generates throttle control data in accordance with the calculated throttle opening degree and provides the throttle control data to the electronic throttle motor 17 to control the opening degree of the electronic throttle.

The control microcomputer 11 generates injection valve control data in correspondence with the present throttle opening degree in accordance with the detection signals from the accelerator opening degree sensor 20 and the vehicle velocity sensor 22, and controls the injection valve 18 in accordance with the injection valve control data. The detection signals from the accelerator opening degree sensor 20, the engine rotation speed sensor 21, and the vehicle velocity sensor 22 are provided to the monitoring IC 12 through the communication between the control microcomputer 11 and the monitoring IC 12.

When a battery BT is initially connected to various electric components of the vehicle and an ignition switch SW is turned on, the checking determination values and either the mirror values or sum of the determination values are simultaneously sent to the monitoring IC 12 from the control microcomputer 11. In the preferred embodiment, the mirror values are complements of the checking determination values and the sum is the total of the determination values. The monitoring IC 12 uses the mirror values or the sum to determine whether or not the received checking determination values are normal. If the checking determination values are normal, the checking determination values are stored in the S-RAM 16.

If the plurality of checking determination values are not normal, the monitoring IC 12 requests the control microcomputer 11 to resend the checking determination values and either the mirror values or the sum of the checking determination values. The monitoring IC 12 determines whether or not the checking determination values resent from the control microcomputer 11 are normal using the resent mirror values or the sum. If the determination values are normal, the resent checking determination values are stored in the S-RAM 16.

If the resent checking determination values are not normal, the monitoring IC 12 uses a plurality of predetermined provisional determination values, which are stored in the S-RAM 16, as the checking determination values.

The monitoring IC 12 receives the detection signal from the accelerator opening degree sensor 20, the engine rotation speed sensor 21, and the vehicle velocity sensor 22 and calculates a determination value corresponding to the present throttle opening degree from the determination values stored in the S-RAM 16 and a determination value for the injection valve control data of the injection valve 18. The monitoring IC 12 retrieves the detection signal of the throttle opening degree sensor, which detects the opening degree of an electronic throttle (not shown), and compares the detection value with determination value data stored in the S-RAM 16 to check whether the control data of the control microcomputer 11 is normal. The monitoring IC 12 retrieves control data, which is provided from the EFI controller 14 to the fuel injection valve 18, and compares the control data with the determination values stored in the S-RAM 16 to check whether or not the control data of the control microcomputer 11 is normal.

A procedure for setting the determination values of the S-RAM 16 in the monitoring IC 12 will now be described with reference to a flow chart in FIG. 2. The series of processes shown in FIG. 2 is executed by the control microcomputer 11 and the monitoring IC 12 each time the vehicle engine is started, that is, each time an ignition switch is turned on.

First, the control microcomputer 11 determines whether or not the connection of the battery BT is the initial connection, that is, whether or not the vehicle has just been manufactured (step S110). If the connecting of the battery BT is determined not to be the initial connection (NO in step S110), the control microcomputer 11 ends the process.

If the connection of the battery BT is determined to be the initial connection (YES in step S110), the control microcomputer 11 simultaneously sends the checking determination values and either the mirror values or sum of the checking determination values to the monitoring IC 12 (step S120).

The monitoring IC 12 determines whether or not the received determination values are normal using the mirror values or the sum (step S130). If the determination values are determined to be normal (YES in step S130), the monitoring IC 12 stores the determination values as the determination values for control data of the control microcomputer 11 in the S-RAM 16 (step S140) and ends the process.

If the values are determined not to be normal (NO in step S130), the monitoring IC 12 requests the control microcomputer 11 to resend the checking determination values and either the mirror values or the sum of the determination values (step S150). The control microcomputer 11 simultaneously resends the checking determination values and either the mirror values or the sum of the checking determination values in response to the request from the monitoring IC 12 (step S160).

The monitoring IC 12 determines whether or not the checking determination values, which are resent from the control microcomputer 11, are normal using the resent mirror values or the sum (step 170). If the resent determination values are determined to be normal (YES in step 170), the monitoring IC 12 stores the resent determination values in the S-RAM 16 (step 140) and ends the process.

If the resent determination values are determined not to be normal (NO in step S170), the monitoring IC 12 uses the predetermined provisional determination values stored in the S-RAM 16 as the determination values (step S180) and completes the process.

The vehicle electronic controller 10 of the present embodiment has the advantages described below.

The control microcomputer 11 of the controller 10 sends the checking determination values to the monitoring IC 12, and the monitoring IC 12 stores the checking determination values in the S-RAM 16. Thus, the same monitoring IC 12 may be used in different vehicles. This reduces the cost of the vehicle ECU 10.

The control microcomputer 11 sends the checking determination values to the monitoring IC 12 only when the battery BT is initially connected and the ignition switch SW is turned on. Therefore, there is a high possibility of the control microcomputer 11 being normal, and the checking determination values are highly reliable.

The control microcomputer 11 simultaneously sends the checking determination values and either the mirror values or sum of the checking determination values to the monitoring IC 12. Therefore, the monitoring IC 12 easily determines whether or hot the checking determination values are normal based on the mirror values or the sum.

If the monitoring IC 12 determines that the checking determination values are determined not to be normal using the mirror values or sum of the checking determination values, the control microcomputer 11 requests the checking determination values and either the mirror values or sum of the checking determination values to be resent. Thus, the monitoring IC 12 receives the determination values and either the mirror values or sum of the determination values again.

The monitoring IC 12 prestores the provisional checking determination values to check the control data of the control microcomputer 11. The monitoring IC 12 employs the provisional checking determination values when determining that the determination values that are received from the control microcomputer 11 for a second time are abnormal from either the mirror values or sum of the monitoring determination values that are received from the control microcomputer 11 for a second time. Accordingly, even if the checking determination values that are received again from the control microcomputer 11 are not normal, the control data of the control microcomputer 11 may be checked with the provisional determination values.

It should be apparent to those skilled in the art that the present invention may be embodied in many other specific forms without departing from the spirit or scope of the invention. Particularly, it should be understood that the present invention may be embodied in the following forms.

Figure 3:
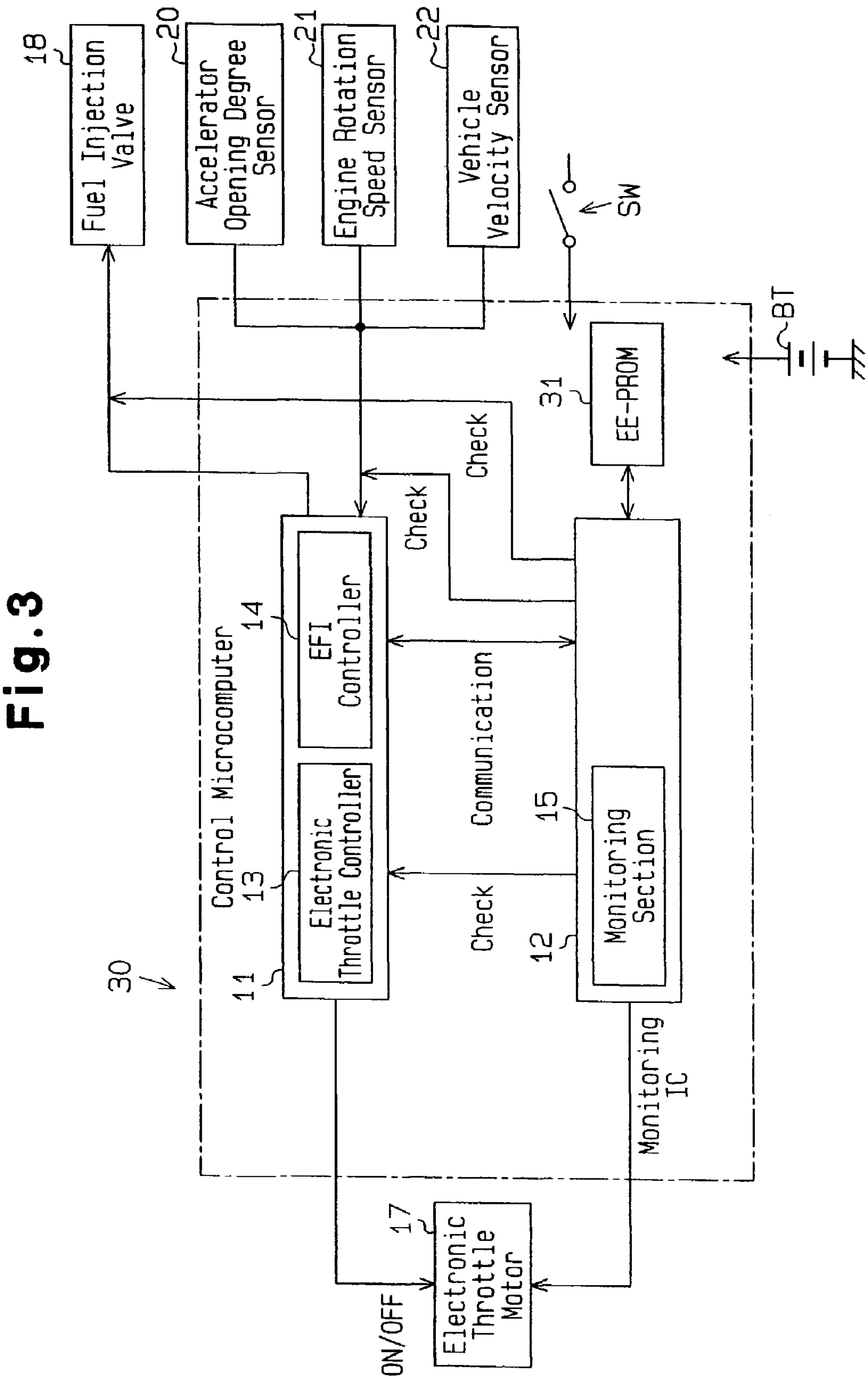
FIG. 3 is a schematic diagram of a vehicle electronic controller according to further embodiment of the present invention.

An electrically erasable programmable (EE-P) ROM 31, which is a non-volatile memory and connected to the monitoring IC 12, may be used in lieu of the S-RAM 16 of the monitoring IC 12, as shown in FIG. 3. In this case, since data of the EE-PROM 31 is not lost, a backup power electric source is not required and a commercially available EE-PROM 31 may be used to reduce the manufacturing cost of the monitoring IC 12.

The monitoring IC 12 may store the checking determination values and either the mirror values or sum of the checking determination values in the S-RAM 16 without determining whether or not the received checking determination values are normal. In this case, the monitoring IC 12 determines whether or not the checking determination values are normal based on either the mirror values or the sum of the checking determination values just before checking the control data of the control microcomputer 11.

The monitoring IC 12 may employ the predetermined provisional determination values stored in the S-RAM 16 as the checking determination values without requiring the control microcomputer 11 to resend the checking determination values and either the mirror values or sum of the checking determination values when the checking determination values are initially determined not to be normal.

The monitoring IC 12 may request the control microcomputer 11 to resend the checking determination values and either the mirror values or sum of checking determination values for a number of times.

The present examples and embodiments are to be considered as illustrative and not restrictive, and the invention is not to be limited to the details given herein, but may be modified within the scope and equivalence of the appended claims.

What is claimed is:

1. An electronic controller for a vehicle having an actuator, the electronic controller comprising:

a control microcomputer for calculating control data to control the actuator in the vehicle in accordance with a driving condition of the vehicle; and a monitoring IC connected to the control microcomputer to perform a check of whether a determination value used by the control microcomputer to check for abnormality of the control data is normal, and if the check indicates that the determination value is normal, storing the determination value;

wherein the control microcomputer has a plurality of determination values, calculates a plurality of mirror values, each of which is complement of a corresponding one of the determination values, calculates a sum of the plurality of determination values, and simultaneously sends either the mirror values or the sum to the monitoring IC together with the determination values.

2. The electronic controller according to claim 1, wherein the monitoring IC determines whether or not the determination values are normal with either the mirror values or the sum and requests the control microcomputer to resend the determination values and either the mirror values or the sum when the determination values are determined not to be normal.

3. The electronic controller according to claim 2, wherein the monitoring IC stores the determination values in the memory device when the plurality of determination values are determined to be normal.

4. The electronic controller according to claim 1, wherein the control microcomputer simultaneously resends the plurality of determination values and either the plurality of mirror values or the sum to the monitoring IC in response to the request, the monitoring IC prestores a provisional determination value to check whether the control data is normal, and the monitoring IC determines whether the resent determination values are normal using either the mirror values or the sum and employs the provisional determination value when the resent determination values are determined not to be normal.

5. The electronic controller according to claim 4, wherein the monitoring IC stores the resent determination values in the memory device when the resent determination values are determined to be normal.

6. The electronic controller according to claim 1, wherein the monitoring IC prestores a provisional determination value to check whether the control data is normal, and the monitoring IC determines whether the determination values are normal using either the mirror values or the sum and employs the provisional determination value when the determination values are determined not to be normal.

7. The electronic controller according to claim 1, wherein the vehicle includes an ignition switch, a battery, and electric components and the control microcomputer sends the determination values to the monitoring IC only when the battery is initially connected to at least one electric component of the vehicle and the ignition switch is turned on.

8. The electronic controller according to claim 1, wherein the actuator is a throttle valve motor, and the control microcomputer is a throttle control microcomputer controlling the throttle valve motor.

9. An electronic controller for a vehicle having an actuator, the electronic controller comprising:

a control microcomputer for calculating control data to control the actuator in the vehicle in accordance with a driving condition of the vehicle;

a monitoring IC connected to the control microcomputer to perform a check of whether a determination value used by the control microcomputer to check for abnormality of the control data is normal; and a rewritable non-volatile memory connected to the monitoring IC, wherein the control microcomputer sends the determination value to the monitoring IC, and the monitoring IC receives the determination value and stores the determination value in the non-volatile memory if the check performed by the monitoring IC indicates that the determination value is normal;

wherein the control microcomputer has a plurality of determination values and calculates a plurality of mirror values, each of which is complement of a corresponding one of the determination values, calculates the sum of the determination values, and simultaneously sends either the mirror values or the sum to the monitoring IC together with the determination values, the monitoring IC determines whether the determination values are normal with either the mirror values or the sum and requests the control microcomputer to resend the determination values and either the mirror values or the sum when the determination values are determined not to be normal, and the monitoring IC stores the determination values in the non-volatile memory when the determination values are determined to be normal.

10. The electronic controller according to claim 9, wherein the control microcomputer simultaneously resends the determination values and either the mirror values or the sum to the monitoring IC in response to the request, the monitoring IC prestores a provisional determination value to check whether the control data is normal, the monitoring IC determining whether the resent determination values are normal with either the resent mirror values or the resent sum and employs the resent provisional determination value when the resent determination values are determined not to be normal, and the monitoring IC storing the resent determination values in the non-volatile memory when the resent determination values are determined to be normal.

11. The electronic controller according to claim 9, wherein the vehicle includes an ignition switch, a battery, and electric components and the control microcomputer sends the determination values to the monitoring IC when the battery is initially connected to at least one electric component of the vehicle and the ignition switch is turned on.

12. The electronic controller according to claim 9, wherein the actuator is a throttle valve motor, and the control microcomputer is a throttle control microcomputer for controlling the throttle valve motor.

13. A method for checking an electronic controller for a vehicle, the electronic controller including a control microcomputer, which calculates control data to control an actuator installed in the vehicle in accordance with a driving condition of the vehicle, and a monitoring IC, which is connected to the control microcomputer, the method comprising:

storing a determination value in the control microcomputer to check whether the control data is normal;

sending the determination value to the monitoring IC from the control microcomputer;

in the monitoring IC, performing a check of whether the determination value is normal; and if the check indicates that the determination value is normal, storing the determination value;

wherein the control microcomputer includes a plurality of determination values and the monitoring IC includes a memory device for storing the determination values in a rewritable manner, the method further comprising:

calculating a plurality of mirror values, each of which is complement of a corresponding one of the determination values, and calculating a sum of the determination values;

simultaneously sending either the mirror values or the sum to the monitoring IC together with the determination values;

determining whether the determination values are normal with the monitoring IC using either the mirror values or the sum;

requesting the control microcomputer to resend the determination values and either the plurality of mirror values or the sum from the monitoring IC when the determination values are determined not to be normal; and storing the plurality of determination values in the memory device when the determination values are determined to be normal.

14. The method according to claim 13, wherein the monitoring IC prestores a provisional determination value to check whether the control data is normal, the method further comprising:

simultaneously resending the determination values and either the mirror values or the sum to the monitoring IC from the control microcomputer in response to the request;

determining whether the resent determination values are normal with the monitoring IC using either the resent mirror values or the resent sum;

checking whether the control data is normal using the provisional determination value when the resent determination values are determined not to be normal; and storing the resent determination values in the memory device when the resent determination values are determined to be normal.

15. The method according to claim 13, wherein the vehicle includes an ignition switch, a battery, and electric components and said sending determination value includes sending the determination values to the monitoring IC only when the battery is initially connected to at least one electric component in the vehicle and the ignition switch is activated.

16. The method according to claim 13, wherein the actuator is a throttle valve motor, and said checking includes sending control data to control the throttle valve motor.

17. The method according to claim 13, wherein the vehicle electronic controller includes a non-volatile memory, which is connected to the monitoring IC and rewritable, the method further comprising:

calculating a plurality of mirror values, each of which is a complement of a corresponding one of the determination values, and calculating a sum of the determination values;

simultaneously sending either the mirror values or the sum to the monitoring IC together with the determination values;

determining whether or not the determination values are normal with the monitoring IC using either the mirror values or the sum;

requesting the control microcomputer to resend the determination values and either the mirror values or the sum from the monitoring IC when the determination value is determined as not being normal; and storing the determination values in the non-volatile memory when the determination values are determined to be normal.

* * * * *